(12) United States Patent
Liu et al.

(10) Patent No.: US 8,593,034 B2
(45) Date of Patent: Nov. 26, 2013

(54) CARBON NANOTUBE BASED ELECTROSTRICTIVE COMPOSITE AND ELECTROSTRICTIVE ELEMENT USING THE SAME

(75) Inventors: Chang-Hong Liu, Beijing (CN); Lu-Zhuo Chen, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 12/868,932

(22) Filed: Aug. 26, 2010

(65) Prior Publication Data
US 2011/0266927 A1 Nov. 3, 2011

(30) Foreign Application Priority Data
Apr. 30, 2010 (CN) .......... 2010 1 0160950

(51) Int. Cl.
*H01L 41/09* (2006.01)
*H01L 41/18* (2006.01)
(52) U.S. Cl.
CPC .......... *H01L 41/0986* (2013.01); *H01L 41/183* (2013.01); *Y10S 310/80* (2013.01)
USPC .......................................... 310/328; 310/800

(58) Field of Classification Search
CPC .................... H01L 41/0986; H01L 41/183
USPC ................................................ 310/328, 800
See application file for complete search history.

(56) References Cited

U.S. PATENT DOCUMENTS

| | | | |
|---|---|---|---|
| 6,020,674 A | 2/2000 | Zhang et al. | |
| 8,049,397 B2 * | 11/2011 | Kato | 310/366 |
| 8,354,772 B1 | 1/2013 | Chen et al. | |
| 2007/0120444 A1 | 5/2007 | Kato et al. | |
| 2007/0247033 A1 * | 10/2007 | Eidenschink et al. | 310/800 |
| 2011/0001398 A1 * | 1/2011 | Kang et al. | 310/363 |
| 2011/0192016 A1 * | 8/2011 | Kang et al. | 29/592.1 |

FOREIGN PATENT DOCUMENTS

TW 201001764 1/2010

* cited by examiner

*Primary Examiner* — Derek Rosenau
(74) *Attorney, Agent, or Firm* — Altis & Wispro Law Group, Inc.

(57) ABSTRACT

An electrostrictive composite includes two electrostrictive layers spaced with each other. The electrostrictive layers extend from a first side to a second side. The first side is spaced with and correspond to the second side. The electrostrictive layers are electrically connected with each other at the first side. The electrostrictive layers are insulated from each other at the second side.

6 Claims, 16 Drawing Sheets

CARBON NANOTUBE BASED ELECTROSTRICTIVE COMPOSITE AND ELECTROSTRICTIVE ELEMENT USING THE SAME

RELATED APPLICATIONS

This application claims all benefits accruing under 35 U.S.C. §119 from China Patent Application No. 201010160950.2, filed on Apr. 30, 2010 in the China Intellectual Property Office, hereby incorporated by reference.

BACKGROUND

1. Technical Field

The present disclosure relates to electrostrictive composites, and particularly, to a carbon nanotube based electrostrictive composite and an electrostrictive element using the same.

2. Description of Related Art

An actuator is a device that converts input energy to mechanical output energy. For example, actuators can be classified into electrostatic, electromagnetic, and electrothermic actuators.

A typical electrothermic actuator has a double-layer structure and includes two metallic layers having different thermal expansion coefficients. When a current is applied, the electrothermic actuator distorts because the thermal expansion coefficients of the two metallic layers are different. However, the electrothermic type actuator has a slow thermal response because the flexibility of the metallic layer is relatively poor.

What is needed, therefore, is to provide an electrostrictive composite having a fast thermal response, and an electrostrictive element using the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
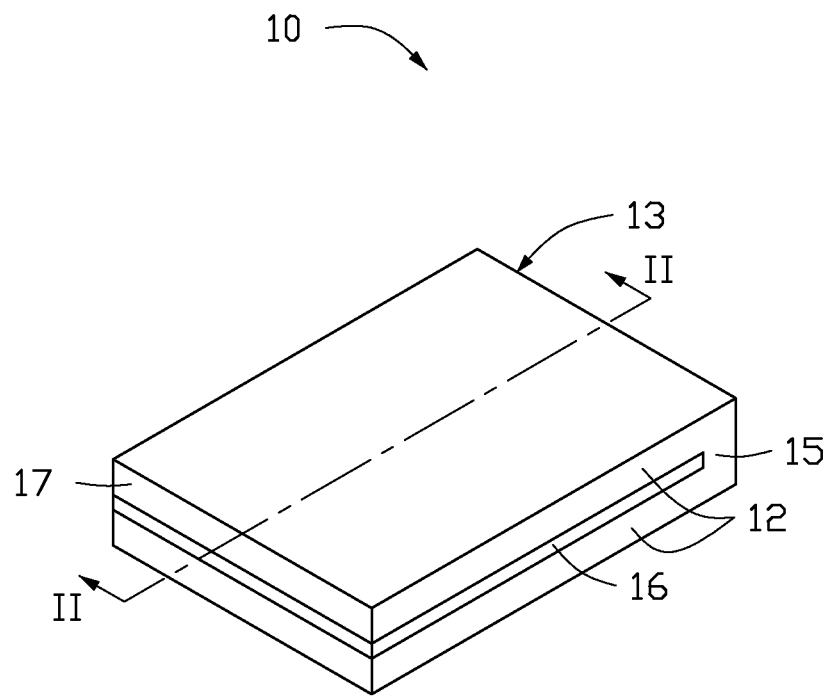
FIG. 1 is a schematic view of one embodiment of an electrostrictive composite.
Figure 2:
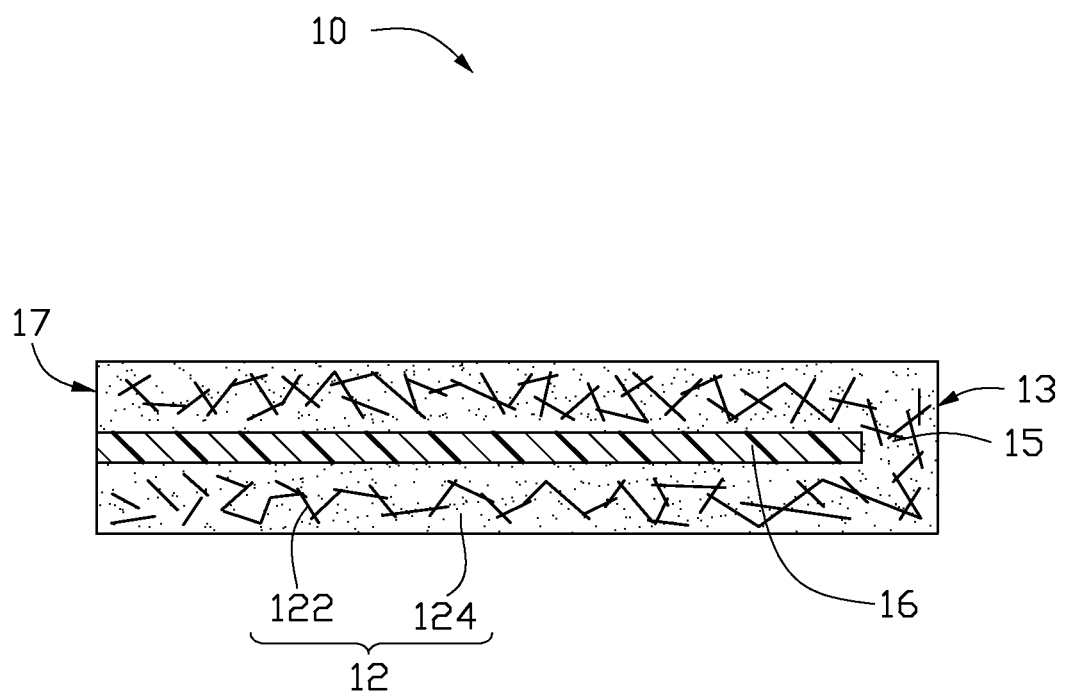
FIG. 2 is a schematic, cross-sectional view, taken along a line II-II of FIG. 1.

Referring to FIG. 1 and FIG. 2, one embodiment of an electrostrictive composite 10 having a planar structure includes a first side 13, a second side 17, two electrostrictive layers 12, an electrical connector 15, and an insulating layer 16. The first side 13 is spaced with and corresponds to the second side 17. The two electrostrictive layers 12 are spaced apart from each other, and extend along a direction from the first side 13 to the second side 17. The insulating layer 16 is located between the two electrostrictive layers 12. The electrical connector 15 is located at the first side 13 of the electrostrictive composite 10. The two electrostrictive layers 12 are electrically connected with each other at the first side 13 via the electrical connector 15. The two electrostrictive layers 12 are electrically insulated from each other at the second side 17 of the electrostrictive composite 10.

The electrostrictive layer 12 includes a flexible polymer matrix 124, and a number of carbon nanotubes 122. The number of carbon nanotubes 122 is disposed in the flexible polymer matrix 124. The number of carbon nanotubes 122 is connected with each other to form a conductive network. A thickness of the electrostrictive layer 12 can range from about 20 micrometers to about 5 millimeters. In one embodiment, the electrostrictive layer 12 is a rectangular sheet, with a thickness of about 1 millimeter, a length of about 20 millimeters, and a width of about 10 millimeters.

The flexible polymer matrix 124 is a sheet material with a thickness in a range from about 20 micrometers to about 5 millimeters. A material of the flexible polymer matrix 124 can be silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or any combination thereof. In one embodiment, the flexible polymer matrix 124 is a substantially rectangular plate made of silicone elastomer with a thickness of about 1 millimeter, a length of about 20 millimeters, and a width of about 10 millimeters.

A weight percentage of the number of carbon nanotubes 122 in the electrostrictive layer 12 can be in a range from about 0.1% to about 6%. The carbon nanotubes 122 can be single-walled carbon nanotubes, double-walled carbon nanotubes, multi-walled carbon nanotubes, or any combination thereof. A length of the carbon nanotubes 122 can be greater than about 1 micrometer. The length of the carbon nanotubes 122 can range from about 50 micrometers to about 900 micrometers in one embodiment. The carbon nanotubes 122 are flexible and have excellent electricity to heat conversion efficiency. The carbon nanotubes 122 are in contact with each other to form a conductive network in the flexible polymer matrix 124, thus the electrostrictive layer 12 is conductive. When a voltage is applied to the electrostrictive layer 12, the carbon nanotubes conductive network will rapidly heat and expand the flexible polymer matrix 124, thus the electrostrictive layer 12 can expand and have a rapid expantion. In one embodiment, the carbon nanotubes are multi-walled carbon nanotubes, and the weight percentage of the number of carbon nanotubes 122 is about 5%.

The insulating layer 16 can be made of flexible insulating polymers. The insulating layer 16 can have a thickness less than the thickness of the electrostrictive layer 12. A material of the insulating layer 16 can be silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or any combination thereof. In one embodiment, the insulating layer 16 is a silicone elastomer film with a thickness of about 0.5 millimeters, a length of about 18 millimeters, and a width of about 10 millimeters.

In one embodiment, the insulating layer 16 is an insulating space defined between the two electrostrictive layers 12. Air can be filled in the insulating space between the two electrostrictive layers 12. If the insulating layer 16 is air, there is less resistance between the two electrostrictive layers 12, thus the electrostrictive composite 10 can respond rapidly during operation.

The electrical connector 15 is located at the first side 13 of the electrostrictive composite 10 and electrically connects the two electrostrictive layers 12. In one embodiment, the electrical connector 15 has the same composition as the electrostrictive layer 12. The electrical connector 15 and the two electrostrictive layers 12 form a whole structure. The carbon nanotubes 122 in the two electrostrictive layer 12 and the electrical connector 15 form a whole conductive network, thus the electrical current can flow from one electrostrictive layer 12 to another electrostrictive layer 12 through the whole conductive network.

Figure 3:
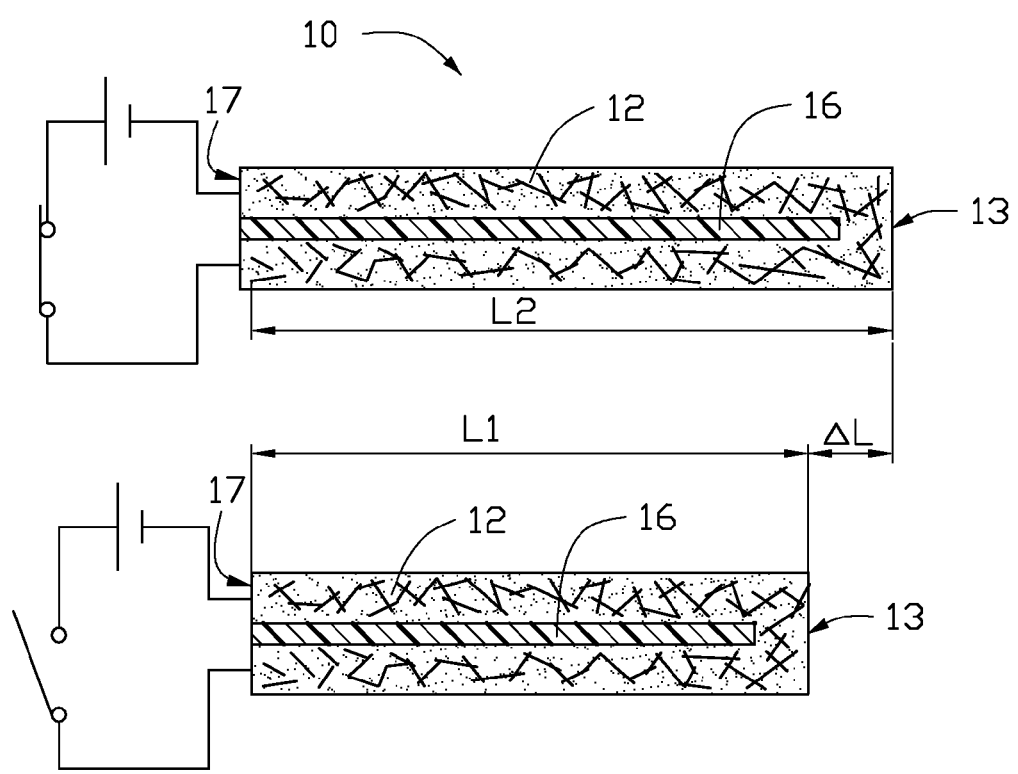
FIG. 3 is the schematic view of the electrostrictive composite of FIG. 1 before and after expansion.

The expansion coefficient of the electrostrictive composite 10 can range from about $10^{-6}$ $K^{-1}$ to about $10^{-3}$ $K^{-1}$. Referring to FIG. 3, in one embodiment, the expansion coefficient of the electrostrictive composite 10 is tested. In the tested embodiment of the electrostrictive composite 10, the flexible polymer matrix 124 is 95 wt % silicone elastomer, and 5 wt % carbon nanotubes 122, which are multi-walled carbon nanotubes. The expansion coefficient $\alpha$ of the electrostrictive composite 10 is calculated according to following formula:

$$\alpha = \frac{L2 - L1}{L1} \times \frac{1}{\Delta T} = \frac{\varepsilon}{\Delta T}$$

where L1 is the original length of the electrostrictive composite 10, L2 is the length of the electrostrictive composite 10 after expansion, $\Delta T$ is the increase of the temperature of the electrostrictive composite 10, $\varepsilon$ is the strain. In one embodiment, the strain $\varepsilon$ of the electrostrictive composite 10 is calculated to be 3.5%. The expansion coefficient $\alpha$ of the electrostrictive composite 10 is calculated to be $3.0 \times 10^{-4} K^{-1}$.

Figure 4:
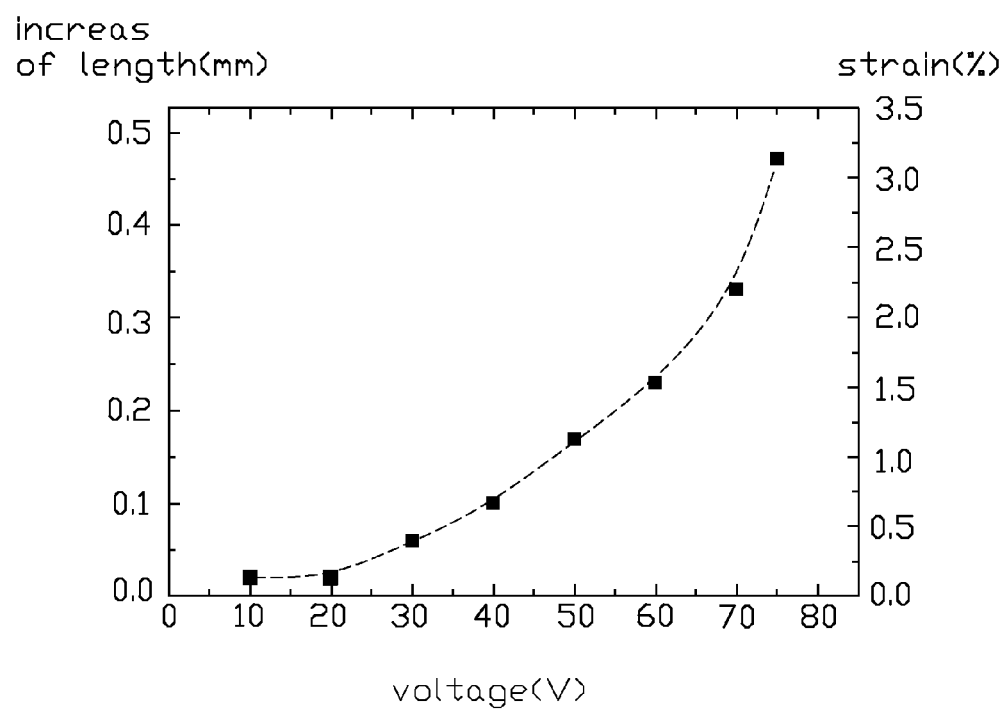
FIG. 4 shows changes of strains and increases of length of the electrostrictive composite in FIG. 2 with increasing voltages.
Figure 5:
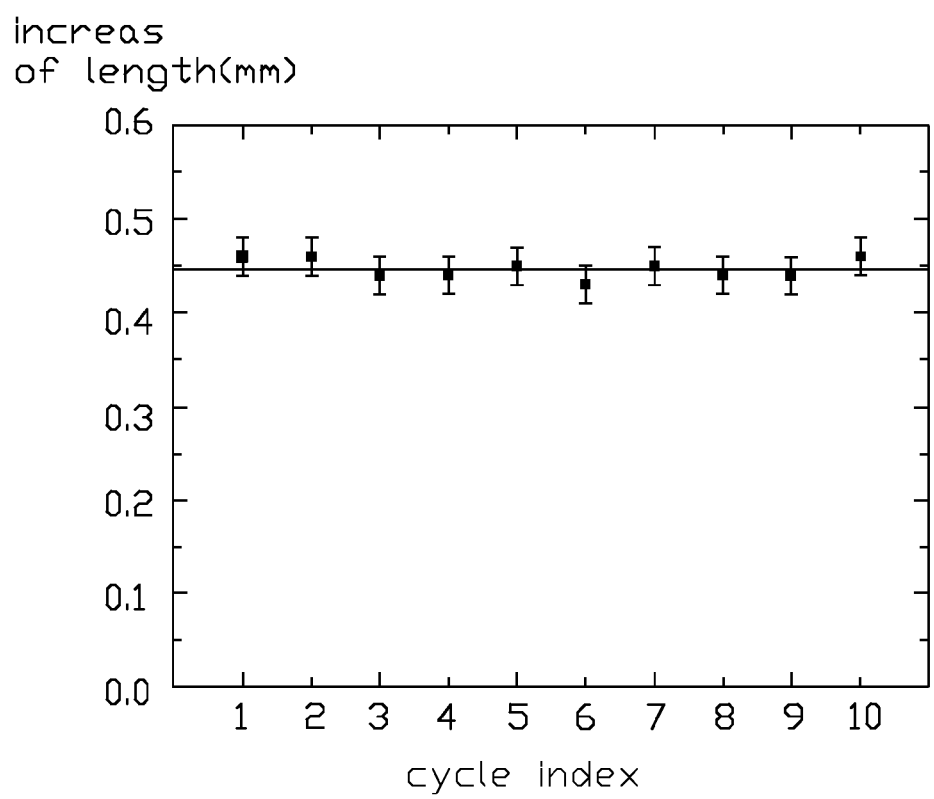
FIG. 5 shows the increases of length in 10 cycles of the electrostrictive composite in FIG. 1.

Referring to FIG. 4, the relation of strain and the increase of the length of the electrostrictive composite 10 at various voltages applied on the electrostrictive composite 10 is shown. As can be seen from FIG. 4, the strain increases with the voltage applied on the electrostrictive composite 10. In FIG. 5, the increase of length in 10 cycles of the electrostrictive composite 10 in one embodiment is shown. As can be seen from FIG. 5, the increase of length in 10 cycles of the electrostrictive composite 10 has substantially the same value. Therefore the electrostrictive composite 10 has good repeatability.

The operating principle of the electrothermic composite 10 is described as follows. As can be seen in FIG. 3, the two electrostrictive layers 12 at the second side 17 are separately electrically connected with two electrodes of an electrical source, therefore, a current flows through the whole conductive network formed by the connected carbon nanotubes 122 in two electrostrictive layers 12 and the electrical connector 15. The carbon nanotubes 122 convert the electric energy to heat thereby heating the electrothermic composite 10, causing the electrothermic composite 10 to expand along from the second side 17 to the first side 13 in a plane of the electrothermic composite 10. The current is inputted in the electrothermic composite 10 from the second side 17, along a direction from the second side 17 to the first side 13, thus, the expansion of the electrothermic composite 10 can be controlled at the first side 13. Therefore, the electrothermic composite 10 can be applied in the field of electrothermic devices.

The electrothermic composite 10 expands in the plane of the electrothermic composite 10. A longitudinal direction of the at least two electrostrictive layers 12 is the direction of the longer length in the planar plane of the electrothermic composite 10. If the length from the first side 13 to the second side 17 is longer, the electrothermic composite 10 would expand greater along a direction from the first side 13 to the second side 17. If the length substantially perpendicular to the direction from the first side 13 to the second side 17 is longer, the electrothermic composite 10 would expand greater along a direction substantially perpendicular to the direction from the first side 13 to the second side 17.

Figure 6:
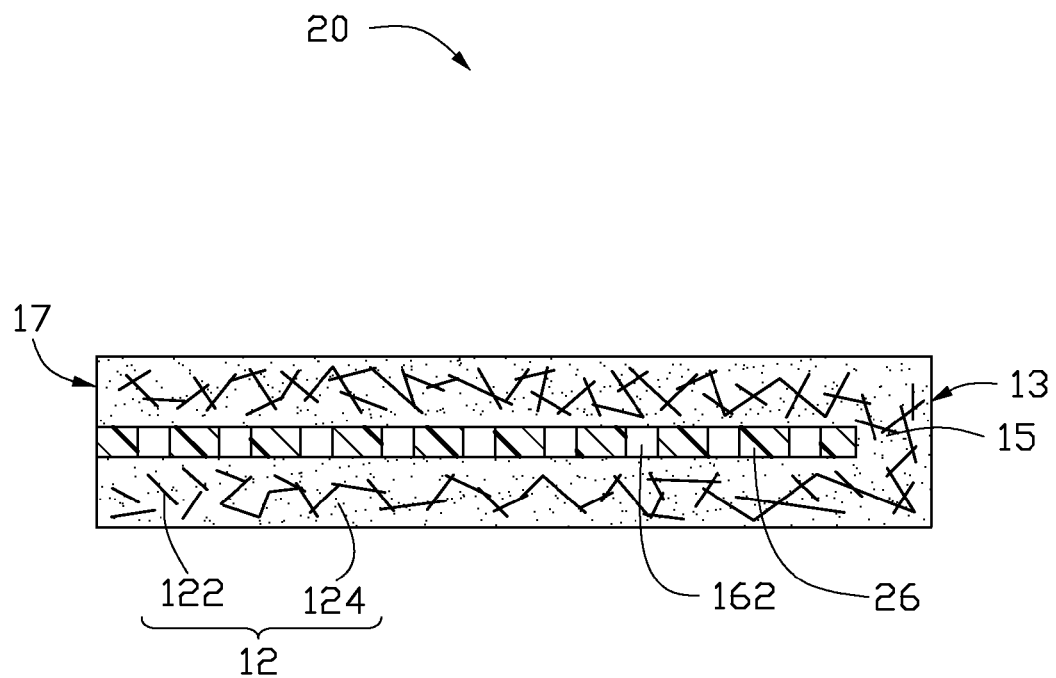
FIG. 6 is a cross-sectional view of another embodiment of an electrostrictive composite.

Referring to FIG. 6, one embodiment of an electrostrictive composite 20 having a planar structure includes a first side 13, a second side 17, two electrostrictive layers 12, an electrical connector 15, and an insulating layer 26. The insulating layer 26 is made of flexible insulating polymers and has a number of air columns 162 disposed therein. The air columns 162 can have a strip configuration and extend along a direction substantially perpendicular to the direction from the first side 13 to the second side 17 of the electrostrictive composite 20. The air columns 162 reduce the contact area between the insulating layer 26 and the two electrostrictive layers 12, therefore, the resistance between the insulating layer 26 and the two electrostrictive layers 12 is reduced, and the electrostrictive composite 20 has a rapid response.

Figure 7:
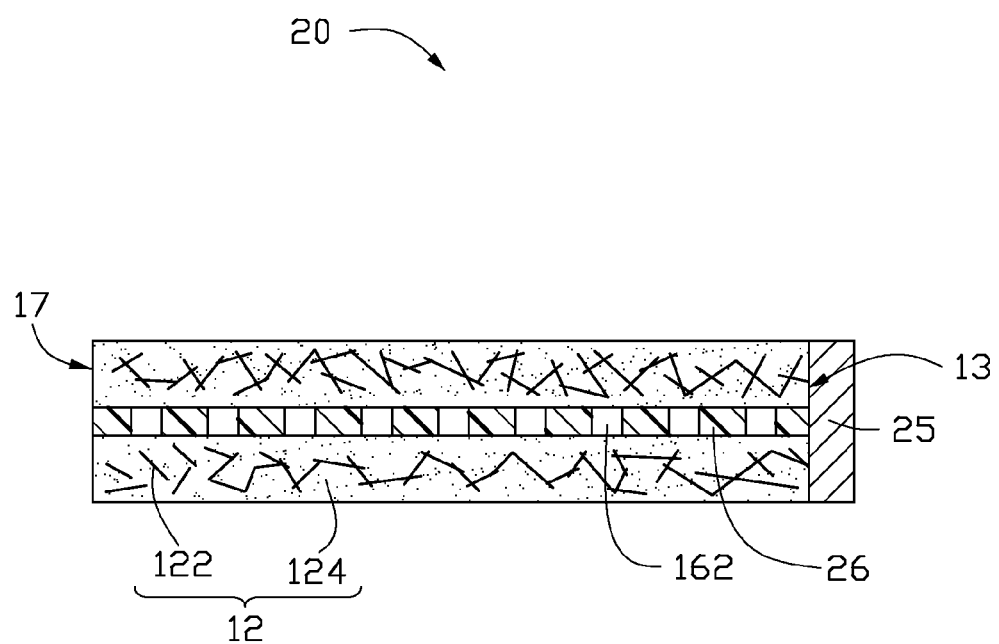
FIG. 7 is a cross-sectional view of one embodiment of an electrostrictive composite having a conductive film used as an electrical connector.

Referring to FIG. 7, in one embodiment an electrical connector 25 of the electrostrictive composite 20 has a composition different with the two electrostrictive layers 12. The electrical connector 25 is a conductive layer located at the first side 13 and covers the parts of the two electrostrictive layers 12 at the first side 13. The two electrostrictive layers 12 are electrically connected with each other via the electrical connector 25. The electrical connector 25 can be made of metal, alloy, conductive resin, indium-tin oxide (ITO), or conductive adhesive. The pure metals and metal alloys can be aluminum, copper, tungsten, molybdenum, gold, cesium, palladium, or any combination thereof. In one embodiment, the electrical connector 25 is a metal layer.

Figure 8:
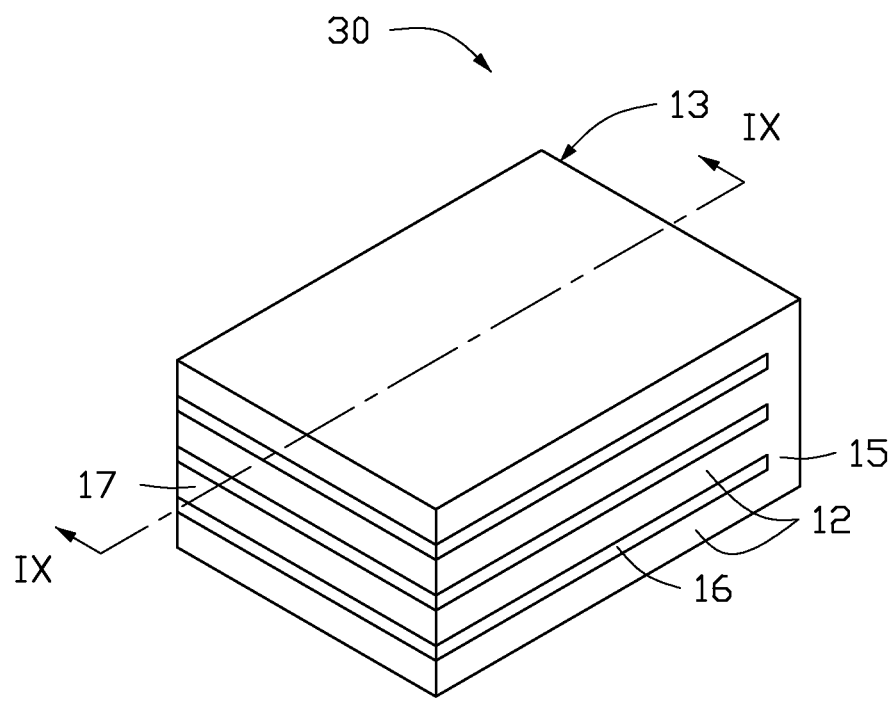
FIG. 8 is a schematic view of one embodiment of an electrostrictive composite.
Figure 9:
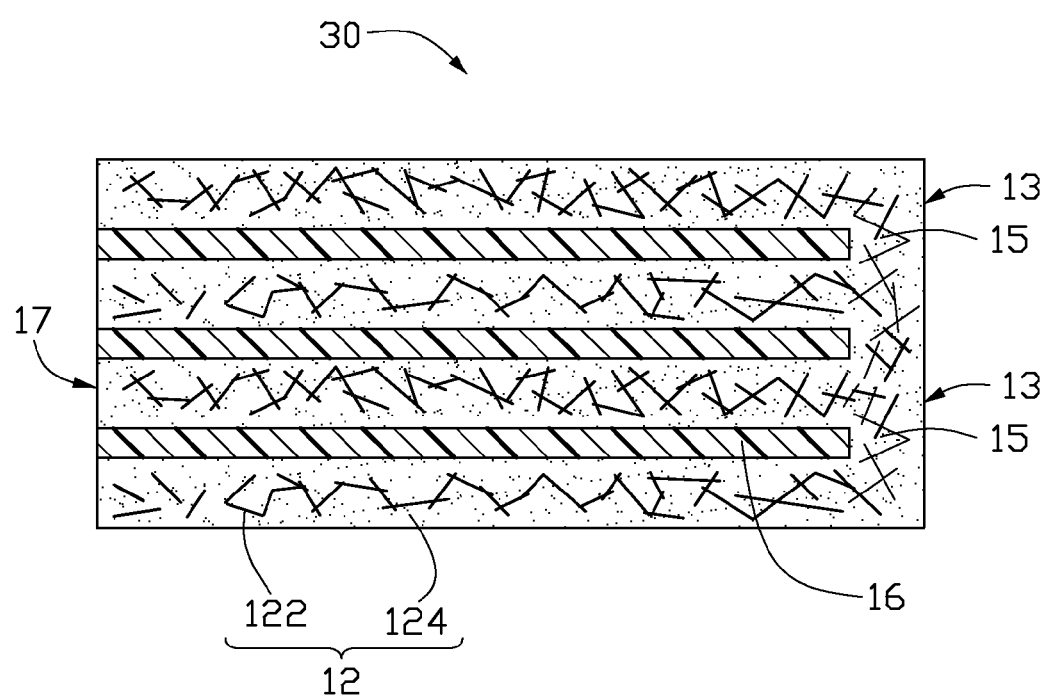
FIG. 9 is a schematic, cross-sectional view, taken along a line IX-IX of FIG. 8.

Referring to FIG. 8 and FIG. 9, an electrostrictive composite 30 has substantially the same structure as the electrostrictive composite 10, except that the electrostrictive composite 30 includes a number of electrostrictive layers 12, and a number of insulating layers 16. In one embodiment, the electrostrictive composite 30 includes four electrostrictive layers 12 and three insulating layers 16.

The number of electrostrictive layers 12 is spaced from and substantially parallel to each other. One insulating layer 16 is located between every two adjacent electrostrictive layers 12. The number of electrostrictive layers 12 can connect the electrical source at the second side 17 in a staggered manner of +−+−. Therefore, the driving voltage of the electrostrictive composite 30 can be decreased.

Figure 10:
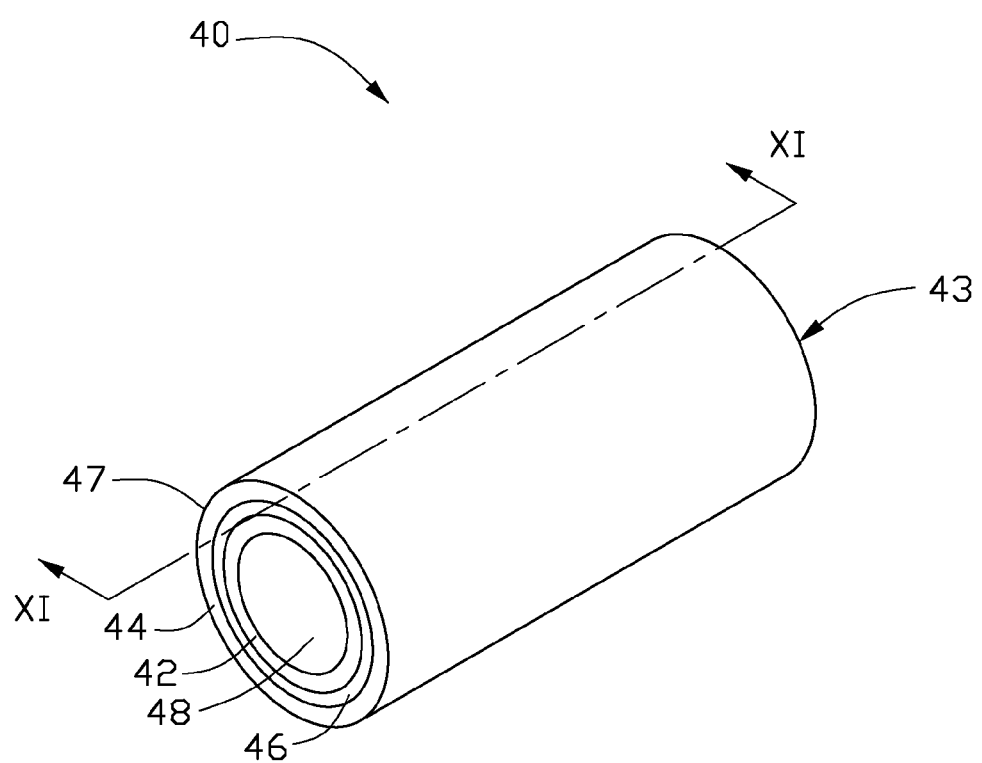
FIG. 10 is a schematic view of one embodiment of an electrostrictive composite.
Figure 11:
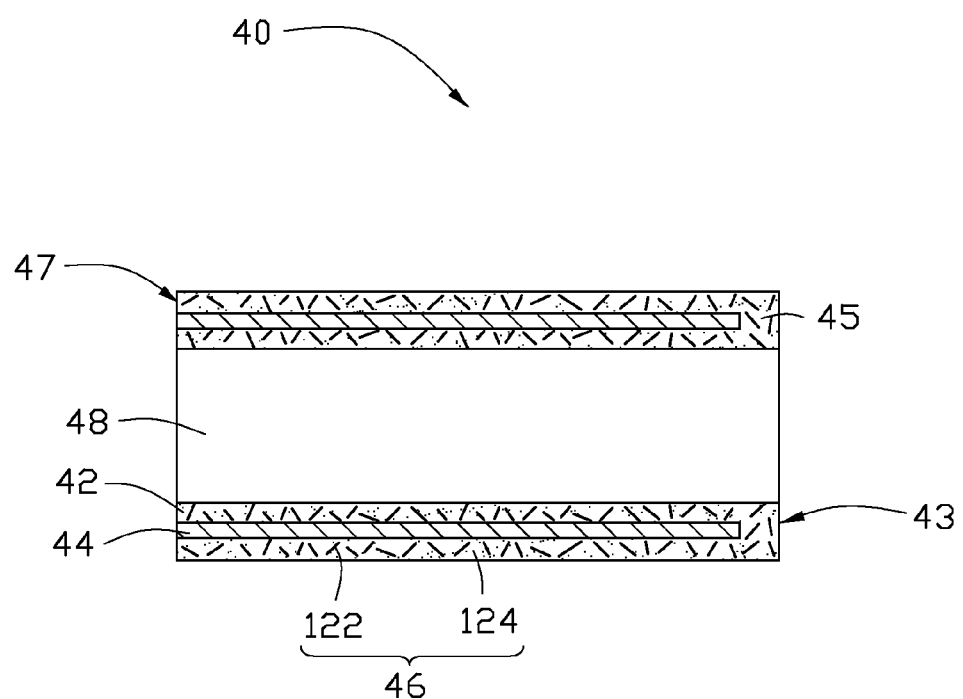
FIG. 11 is a schematic, cross-sectional view, taken along a line XI-XI of FIG. 10.

Referring to FIG. 10 and FIG. 11, one embodiment of an electrostrictive composite 40 having a column structure includes a first side 43, a second side 47, a first electrostrictive layer 42, a second electrostrictive layer 46, an electrical connector 45, and an insulating layer 44. The first side 43 is spaced apart from and corresponds to the second side 47. The first electrostrictive layer 42 is a hollow cylinder structure. The first electrostrictive layer 42 defines a hollow space 48. The insulating layer 44 is disposed on an outer circumferential surface of the first electrostrictive layer 42. The second electrostrictive layer 46 is disposed on an outer circumferential surface of the insulating layer 44. The first electrostrictive layer 42, the second electrostrictive layer 46, and the insulating layer 44 are coaxial. The electrical connector 45 is located at the first side 43 of the electrostrictive composite 40 and electrically connects the first electrostrictive layer 42 and the second electrostrictive layer 46.

The first electrostrictive layer 42 and the second electrostrictive layer 46 have a same composition as the electrostrictive layer 12, which includes a flexible polymer matrix 124, and a number of carbon nanotubes 122. The electrical connector 45 has substantially the same composition as the electrical connector 15. The insulating layer 44 has substantially the same composition as the insulating layer 16.

Figure 12:
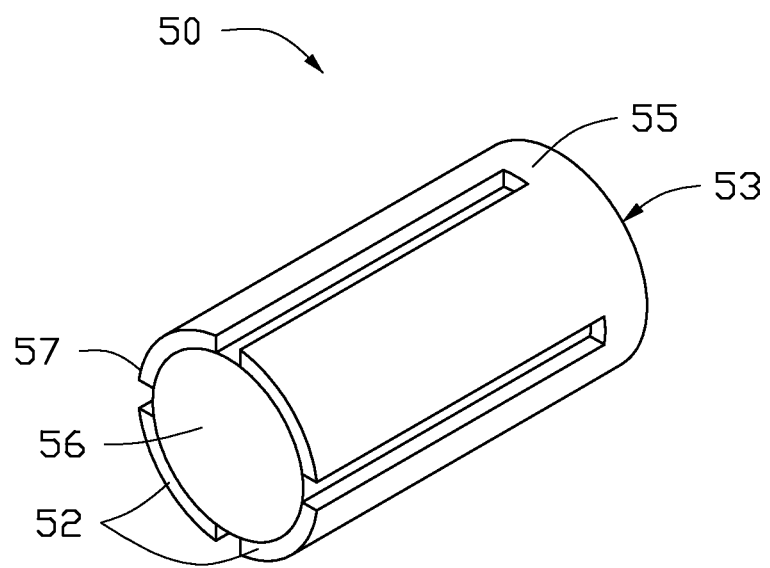
FIG. 12 is a schematic structural view of one embodiment of an electrostrictive composite.

Referring to FIG. 12, one embodiment of an electrostrictive composite 50 has a column structure that includes a first side 53, a second side 57, at least two electrostrictive layers 52, and an electrical connector 55, and a cylinder supporter 56. The at least two electrostrictive layers 52 are spaced and disposed on an outer circumferential surface of the cylinder supporter 56. The electrical connector 55 is located at the first side 53 of the electrostrictive composite 50, to electrically connect the at least two electrostrictive layers 52 at the first side 53. The electrical connector 55 and the at least two electrostrictive layers 52 form a whole structure, and define a space to accept the cylinder supporter 56. In one embodiment, the electrostrictive composite 50 includes four electrostrictive layers 52. The electrostrictive layers 52 have substantially the same composition as the electrostrictive layers 12. The electrical connector 55 has substantially the same composition as the electrical connector 15. The cylinder supporter 56 has a same composition as the insulating layer 16.

Figure 13:
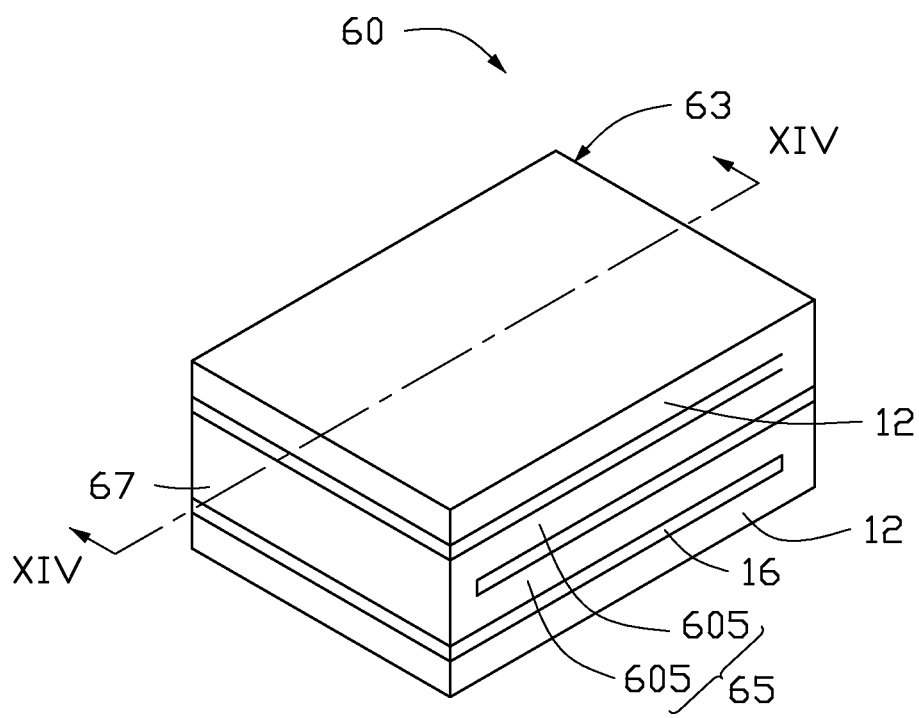
FIG. 13 is a schematic view of one embodiment of an electrostrictive composite.
Figure 14:
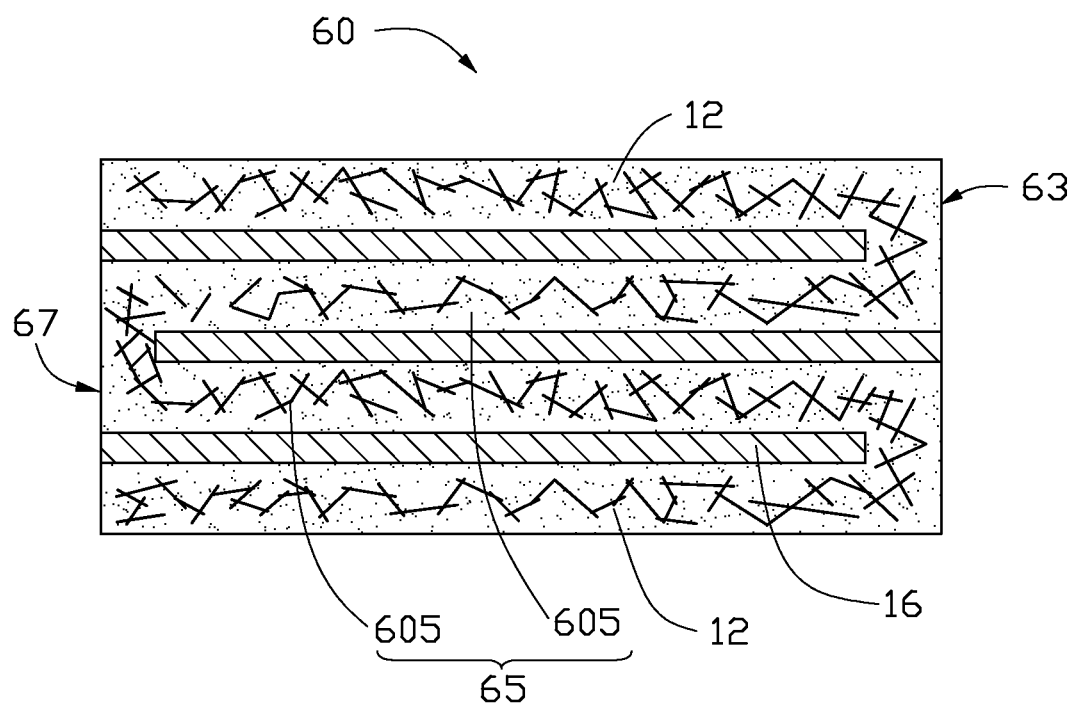
FIG. 14 is a schematic, cross-sectional view, taken along a line XIV-XIV of FIG. 13.

Referring to FIG. 13 and FIG. 14, one embodiment of an electrostrictive composite 60 having a planar structure includes a first side 63, a second side 67, two electrostrictive layers 12, an electrical connector 65, and at least three insulating layers 16.

The two electrostrictive layers 12 are substantially parallel to and spaced apart from each other. The electrical connector 65 is located between the two electrostrictive layers 12. The electrical connector 65 includes at least two conductive layers 605 spaced apart from and substantially parallel to each other. The number of the at least two conductive layers 605 is even. The number of the insulating layers 16 is odd, and one more than the even number of the at least two conductive layers 605. One insulating layer 16 is located between every two adjacent conductive layers 605. Every two adjacent conductive layers 605 are electrically connected at the first side 63 or the second side 67, therefore the at least two conductive layers 605 form a whole electrically conductive structure. Two insulating layers 16 are located between the two electrostrictive layers 12 and the electrically conductor 65. The two electrostrictive layers 12 are electrically connected with each other via the electrical connector 65 at the first side 63 of the electrostrictive composite 60. The electrical connector 65 has substantially the same composition as the electrostrictive layers 12. In one embodiment, the electrostrictive composite 60 includes three insulating layers 16. The electrical connector 65 includes two conductive layers 605.

In other embodiments, an electrostrictive composite 70 based on the structure of the electrostrictive composite 10, 20, 30, or 60 is provided. The electrostrictive composite 70 is formed by applying a second material layer 72 on a surface of the electrostrictive composite 10, 20, 30, or 60. The electrostrictive composite 70 can distort along a direction from the electrostrictive composite 10, 20, 30, or 60 to the second material layers 72.

Figure 15:
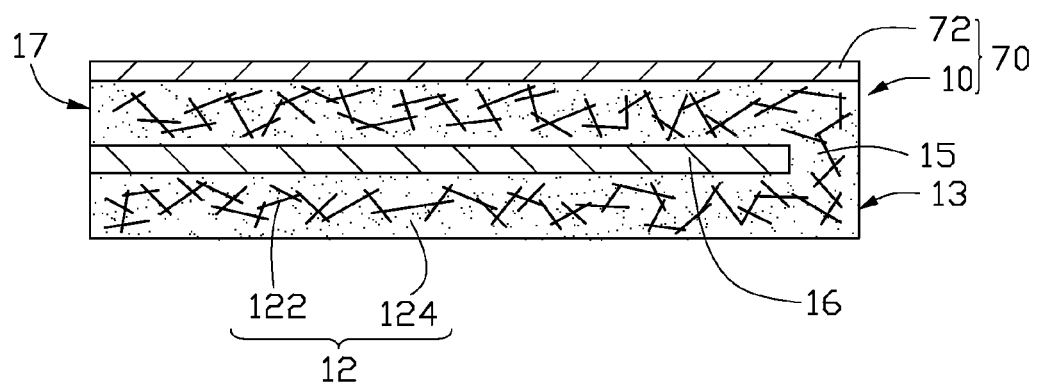
FIG. 15 is a schematic, cross-sectional view of one embodiment of an electrostrictive composite.

Referring to FIG. 15, in one embodiment, the electrostrictive composite 70 includes a second material layer 72 and an electrostrictive composite 10. The second material layer 72 is coated on a surface of the electrostrictive composite 10. A material of the second material layer 72 can be silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene or any combination thereof. The material of the second material layer 72 is different from the material of the flexible polymer matrix 124. Therefore, the thermal expansion coefficients of the flexible polymer matrix 124 and second material layer 72 are different so that the electrothermic composite 70 distorts in a direction with a smaller thermal expansion coefficient. In one embodiment, the second material layer 72 is made of poly methyl methacrylate.

In other embodiments, an electrothermic element 100 based on the electrostrictive composite 10, 20, 30, or 60 is provided. The electrothermic element 100 can be formed by applying corresponding electrodes on the electrostrictive composite 10, 20, 30, or 60.

Figure 16:
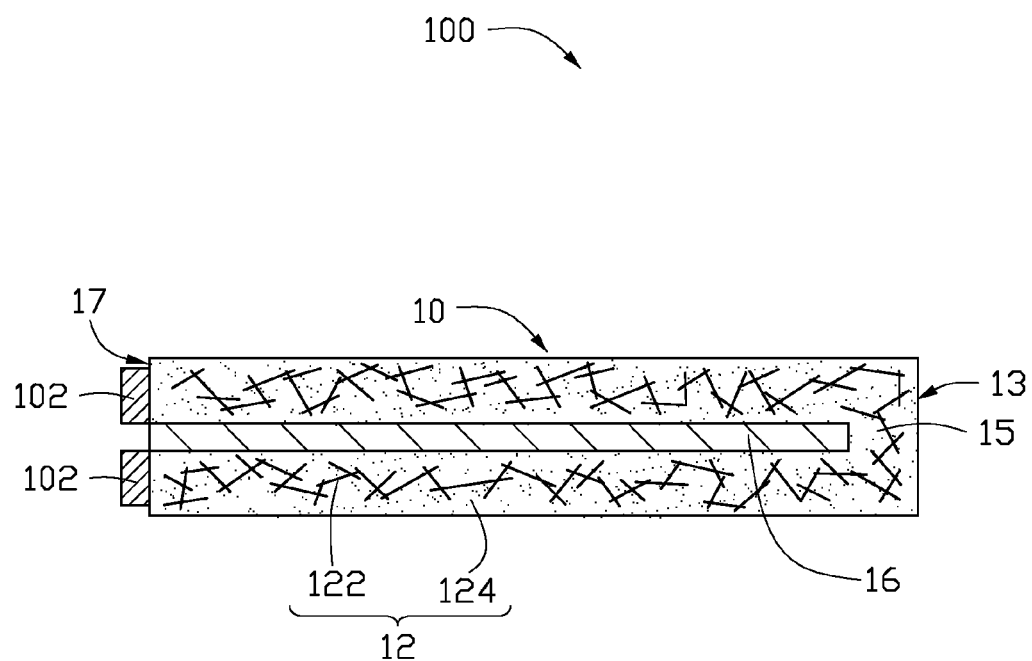
FIG. 16 is a schematic, cross-sectional view, of one embodiment of an electrostrictive element.

Referring to FIG. 16, in one embodiment, the electrothermic element 100 includes two electrodes 102 and an electrothermic composite 10. The two electrodes 102 are located at the second side 17 of the electrothermic composite 10, and electrically connected separately with the two electrostrictive layers 12.

The electrode 102 is made of a conductive material. The shape of the electrode 102 is not limited and can be lamellar, rod, wire, and block among other shapes.

A material of the electrode 102 can be metals, conductive adhesives, carbon nanotubes, and indium tin oxides among other conductive materials. The electrode 102 can be metal wire or conductive material layers, such as metal layers formed by a sputtering method, or conductive paste layers formed by a screen-printing method. In one embodiment, the electrode 102 is a metal wire.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electrostrictive composite comprising:
   two electrostrictive layers electrically connected to each other at a first side, and spaced and insulated from each other at a second side, wherein the first side is opposite to the second side, the two electrostrictive layers are substantially parallel to each other and spaced with each other, and the two electrostrictive layers extend from the first side to the second side, wherein each of the two electrostrictive layers comprises a flexible polymer matrix and a plurality of carbon nanotubes disposed in the flexible polymer matrix, a conductive network is formed by the plurality of carbon nanotubes interconnected with each other; and an electrical connector located at the first side, wherein the two electrostrictive layers are electrically connected with each other via the electrical connector.

2. The electrostrictive composite of claim 1, wherein the electrical connector comprises carbon nanotubes, the carbon nanotubes in the electrical connector and the plurality of carbon nanotubes in the electrostrictive layers are connected with each other and form a whole conductive network.

3. The electrostrictive composite of claim 1, wherein the electrical connector is a conductive metal layer.

4. The electrostrictive composite of claim 1, wherein the flexible polymer matrix is made of silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene, or combinations thereof.

5. The electrostrictive composite of claim 4, wherein a weight percentage of the plurality of carbon nanotubes in the two electrostrictive layers is in a range from about 0.1% to about 6%.

6. The electrostrictive composite of claim 1, wherein the two electrostrictive layers have a planar structure.

* * * * *